United States Patent
Hellriegel et al.

(10) Patent No.: US 6,700,070 B1
(45) Date of Patent: Mar. 2, 2004

(54) ALIGNMENT MARK FOR PLACEMENT OF GUIDE HOLE

(75) Inventors: Stephen V. R. Hellriegel, Bainbridge Island, WA (US); Alexander I. Yatskov, Kenmore, WA (US)

(73) Assignee: Cray Inc., Seattle, WA (US)

( * ) Notice: Subject to any disclaimer, the term of this patent is extended or adjusted under 35 U.S.C. 154(b) by 78 days.

(21) Appl. No.: 09/705,369

(22) Filed: Nov. 3, 2000

(51) Int. Cl.⁷ .................................................. H05K 1/00
(52) U.S. Cl. ........................................ 174/255; 174/250
(58) Field of Search ................................. 174/255, 250, 174/254; 361/727–774; 257/797

(56) References Cited

U.S. PATENT DOCUMENTS

| | | | | | |
|---|---|---|---|---|---|
| 5,682,297 | A | * | 10/1997 | Silva | 174/260 |
| 5,822,191 | A | * | 10/1998 | Tagusa et al. | 174/254 |
| 6,037,671 | A | * | 3/2000 | Kepler et al. | 257/622 |
| 6,201,193 | B1 | * | 3/2001 | Hashimoto | 174/255 |
| 6,342,735 | B1 | * | 1/2002 | Colelli et al. | 257/797 |

* cited by examiner

*Primary Examiner*—David L. Talbott
*Assistant Examiner*—Jeremy Norris
(74) *Attorney, Agent, or Firm*—Harold H. Bennett, II; Seed IP Law Group PLLC

(57) ABSTRACT

The field of the manufacture of electronic components, specifically to manufacturing flexible conductive strips having contact pads thereon, wherein a first set of alignment marks are provided on a substrate. Using the first set of alignment marks, several electronic components are formed in selected positions on the substrate. The electronic components may be formed in various groups, with a first group being formed using a first mask then, subsequent groups being formed using subsequent masks. Each of the respective masks are aligned with the first set of alignment marks in order to position the electronic components formed using the masks at the desired locations on the substrate.

A second set of alignment marks are produced using the same mask as a set of electronic components that are located on the substrate. Subsequently, when a different set of features is produced, it is positioned using the second set of alignment marks located on the individual parts. Thus, tolerances can be achieved that would normally be possible only in the manufacture of individual parts, while still obtaining the advantages of the economies of scale possible by making many parts on a large sheet.

32 Claims, 5 Drawing Sheets

ALIGNMENT MARK FOR PLACEMENT OF GUIDE HOLE

TECHNICAL FIELD

The present invention relates to the field of the manufacture of electronic components and more particularly to manufacturing flexible conductive strips having contact pads thereon.

BACKGROUND OF THE INVENTION

Many manufacturing processes require the use of masks, film transparencies, or other full scale patterns to control the execution of successive steps in the process. In many cases, the positioning of the product of each step is critical to the location of subsequent steps, or products thereof. It is customary, therefore, to establish registration guides, or alignment marks, at the beginning of a process, which are used to guide the placement of each succeeding step.

For example, in the manufacture of electronic circuit components, the process might begin with a substrate material and include steps such as selective plating, etching, cutting or perforating, insulating overlays, etc. Each step requires a separate registration routine in order to ensure that each part of the process is executed in the correct position, relative to the preceding and succeeding steps. To facilitate this, the designer provides alignment marks, which might be comprised of particular visible features on the substrate, or a series of holes in the substrate, to which the individual masks or steps of the process are aligned. Thus each step, being faithful to the same alignment marks, would be in the correct position relative to each other.

A manufacturer might, for the sake of economy, choose to position many small, identical components on a single large piece of substrate, or master sheet. To do this the masks would have the art for all the parts on the sheet, and would be matched to a single set of alignment marks on the master sheet The larger the number of parts that can be made on a single piece of material, the lower the cost of each individual part.

However, as the size of the master sheet grows, the deviations from perfect registration also increase. Parallax, dimensional stability and uneven tension are among the contributors to such deviations. When the masks and substrate are small, the deviations are correspondingly small. When the master sheet is larger, the designer must accommodate looser tolerances.

In the manufacture of some components, there are many steps in the manufacturing process, only a few of which require very close tolerances, but because of those few steps it becomes necessary to limit the size of the master sheet to one or only a few parts in order to achieve that tolerance, making the parts more costly than they might otherwise have been.

SUMMARY OF THE INVENTION

According to principles of the present invention, a first set of alignment marks are provided on a substrate. Using the first set of alignment marks, several electronic components are formed in selected positions on the substrate. The electronic components may be formed in various groups, with a first group being formed using a first mask then, subsequent groups being formed using subsequent masks. Each of the respective masks are aligned with the first set of alignment marks in order to position the electronic components formed using the masks at the desired locations on the substrate.

A second set of alignment marks are produced using the same mask as a set of electronic components that are located on the substrate. Subsequently, when a different set of features is produced, it is positioned using the second set of alignment marks located on the individual parts. Thus, tolerances can be achieved that would normally be possible only in the manufacture of individual parts, while still obtaining the advantages of the economies of scale possible by making many parts on a large sheet. In addition, the subsequent sets of features will be more precisely located with respect to the second set of electronic components than would be possible using the first set of alignment marks.

DETAILED DESCRIPTION OF THE INVENTION

Figure 1:
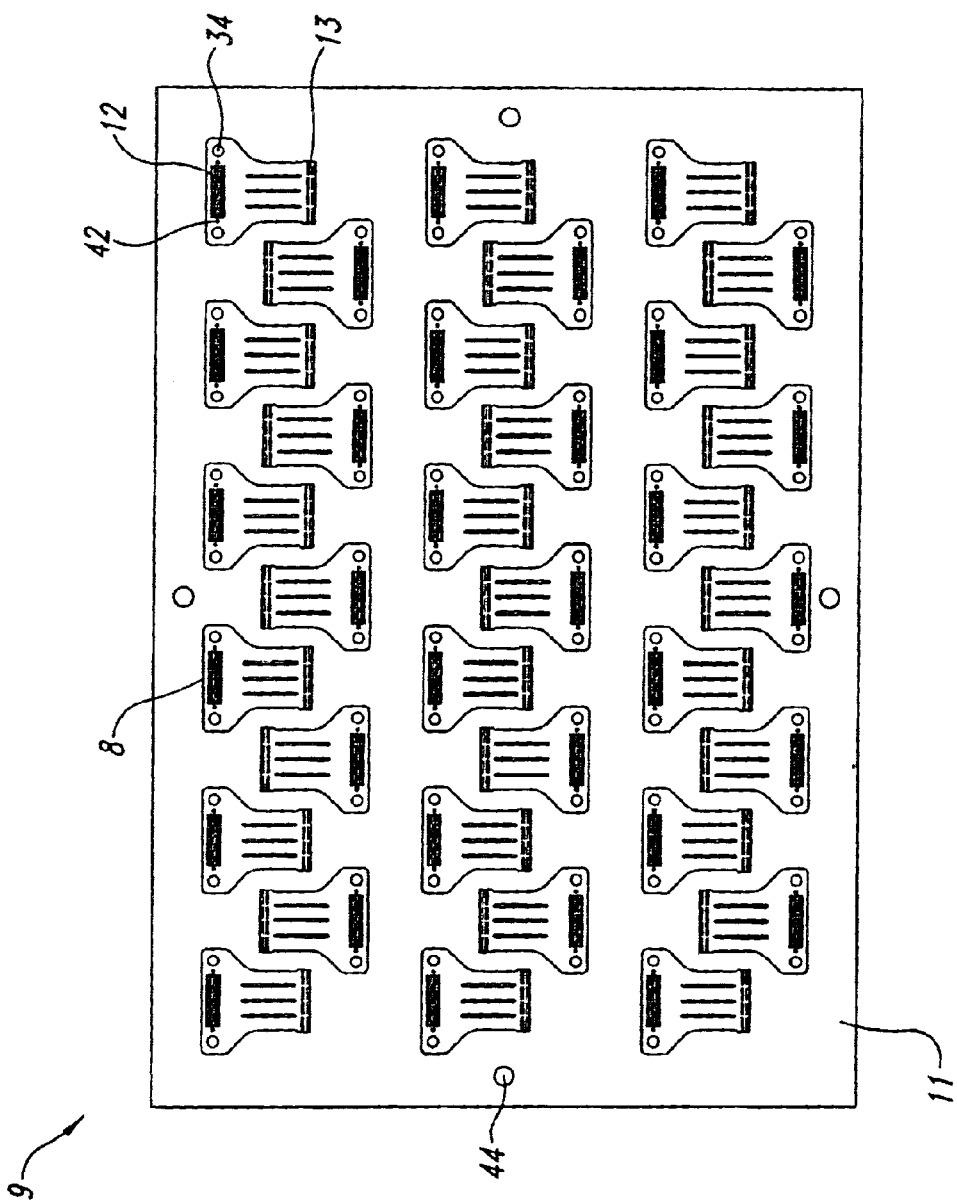
FIG. 1 is a plan view of a master sheet showing a plurality of individual connectors.

FIG. 1 is a plan view of a master sheet 9, such as might be used in the manufacture of flexible connectors. The master sheet 9 begins as a single substrate 11 on which will be formed a plurality of electrical connectors 8. A large number of electrical connectors are formed simultaneously and then, after being formed, are cut from the single sheet for individual use. The flexible connectors 8 are shown ganged on the master sheet 9 in one possible configuration. The practice of ganging parts on larger master sheets 9 or substrates is common in the industry, and can be done in many numbers and configurations. FIG. 1 is shown as an example only. In employing this invention, the manufacturer may choose to use any combination of number of parts and configuration on the master sheet.

Alignment marks 44 used to align each mask and the various steps in the manufacturing process are positioned on the master sheet 9. For example, the alignment marks may be guide holes and registration pins would be placed in the guide holes of the master sheet, to align a matching set of guide holes in an etching mask, to provide precise positioning for the etch. In a later step, pins in the same guide holes might be used to position a mask for an insulation layer, or to laminate two layers together, etc. While guide holes are one structure that could be used for alignment, other structures and methods may be used, including optical registration marks, electrical signals, etc.

The master sheet 9, shown in FIG. 1, shows a plurality of flexible connectors 8 which have been formed thereon by carrying out a large number of steps. At each step, a set of electrical component features are formed such as conductive traces, insulating layers, contact pads, additional insulating layers between respective conductive trace layers, and the like. After the steps have been carried out to completely form significant parts of each individual connector 8, it may be necessary to form some electrical components with more precision than can be obtained using the alignment marks 44 positioned on the master sheet. However, for reasons of economy and operation, it is desirable to perform as many steps as possible on the master sheet prior to cutting each of the individual connectors 8 out of the master sheet. Accordingly, as will be explained herein, an alignment mark 42 is formed on each of the individual connectors 8 while they are still connected to the master sheet. The alignment mark is preferably formed using the same mask and the same set process steps that are used to form other electronic components on the substrate. The tolerances between individual components on a single mask layer are extremely tight, since a single mask can be made very precisely, to very tight tolerances. Accordingly, the position of the additional registration marks 42 relative to other electronic components formed in the same step is extremely accurate to a high degree of precision. Thus, if the alignment marks 42 are used there is a high degree of reliability that they will be precisely located with respect to the electronic components made in the same process step even through the electronic components formed were positioned using a mask aligned with the master sheet alignment marks 44. Between subsequent formation steps, the second set of alignment marks 42 may be used to form additional electrical components or other features on the substrate 9. However, in this instance the registration marks are now positioned on each individual connector 8 and thus there will be fewer errors due to sheet deflection, stretching, or physical differences across the sheet. In addition, since the second set of alignment marks 42 were made in the same process steps as other features, any subsequent features made using the second set of alignment marks 42 will be similarly precisely aligned with any electronic components made with the same mask layer as those which made the alignment marks 42. This provides a high degree of precision for the formation of subsequent electronic components that were formed previously with the formation of the alignment marks 42. Thus, while the alignment of subsequent electronic components features may not be as precise and accurate with respect to the first formed electronic components using the alignment marks of the master sheet they will be much more precise for some of the components on each individual connector 8. Thus, those components on connector 8 for which extremely high precision in location is required will be formed using the subsequent registration marks 42 whereas those electronic components features for which high precision is not as important may be formed using alignment marks 44 of the master sheet.

Figure 2:
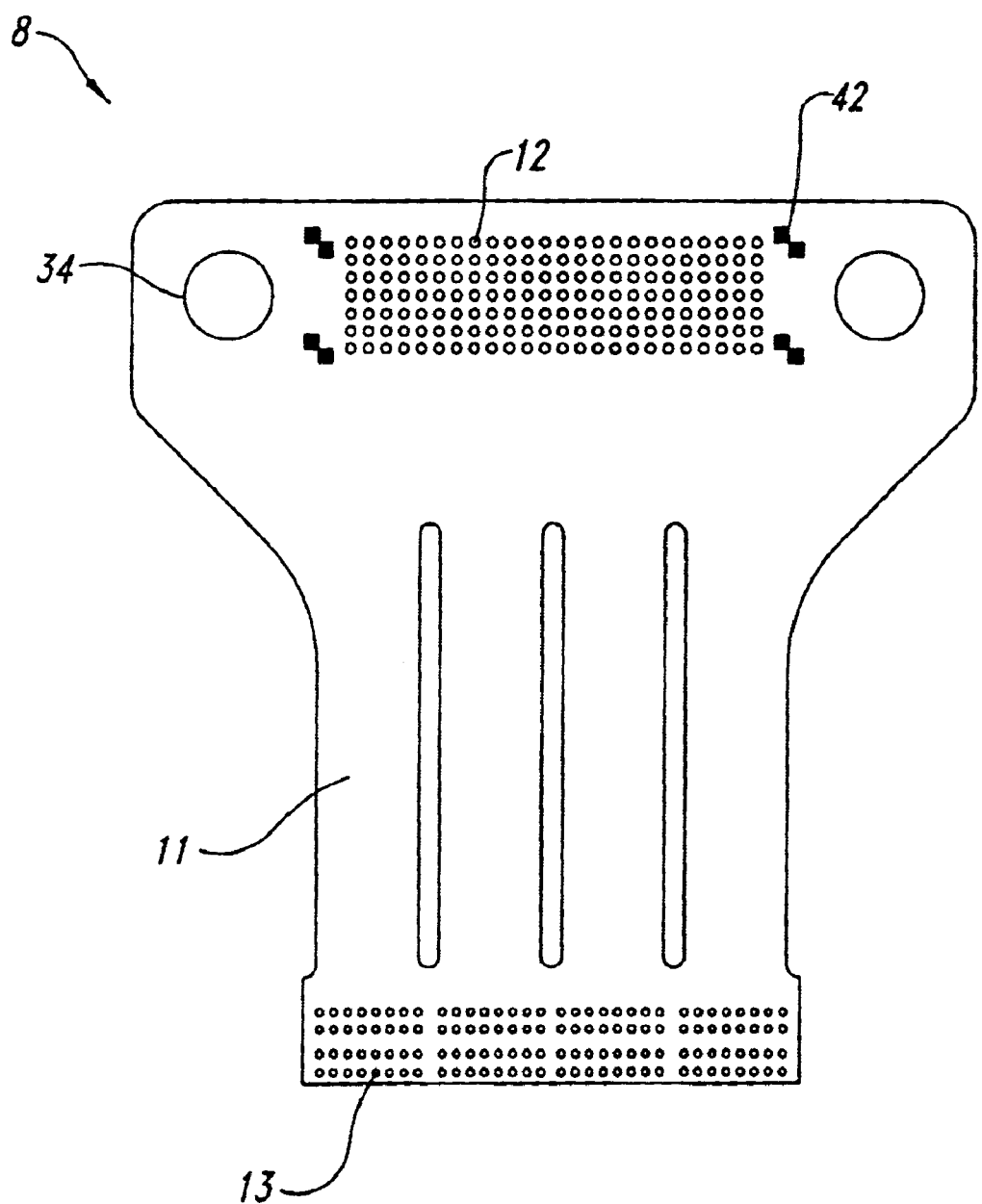
FIG. 2 is a single connector, showing the alignment marks and contact pads.

FIG. 2 shows a single connector 8 that has been cut from the master sheet 9. Contact pads 12 are on one end of the connector and contact pads 13 are at the other end. In the case of the connector in this example, alignment holes 34 are to be used later to correctly position the connector on a circuit board or other electronic device. The position of these alignment holes 34 relative to the contact pads 12 is critical to ensure good connections with all the pads on the circuit board. According to the principles of the invention, alignment marks 42 are employed to facilitate the correct positional relationship between the alignment holes 36 and the contact pads 12 as explained herein.

Figure 3:
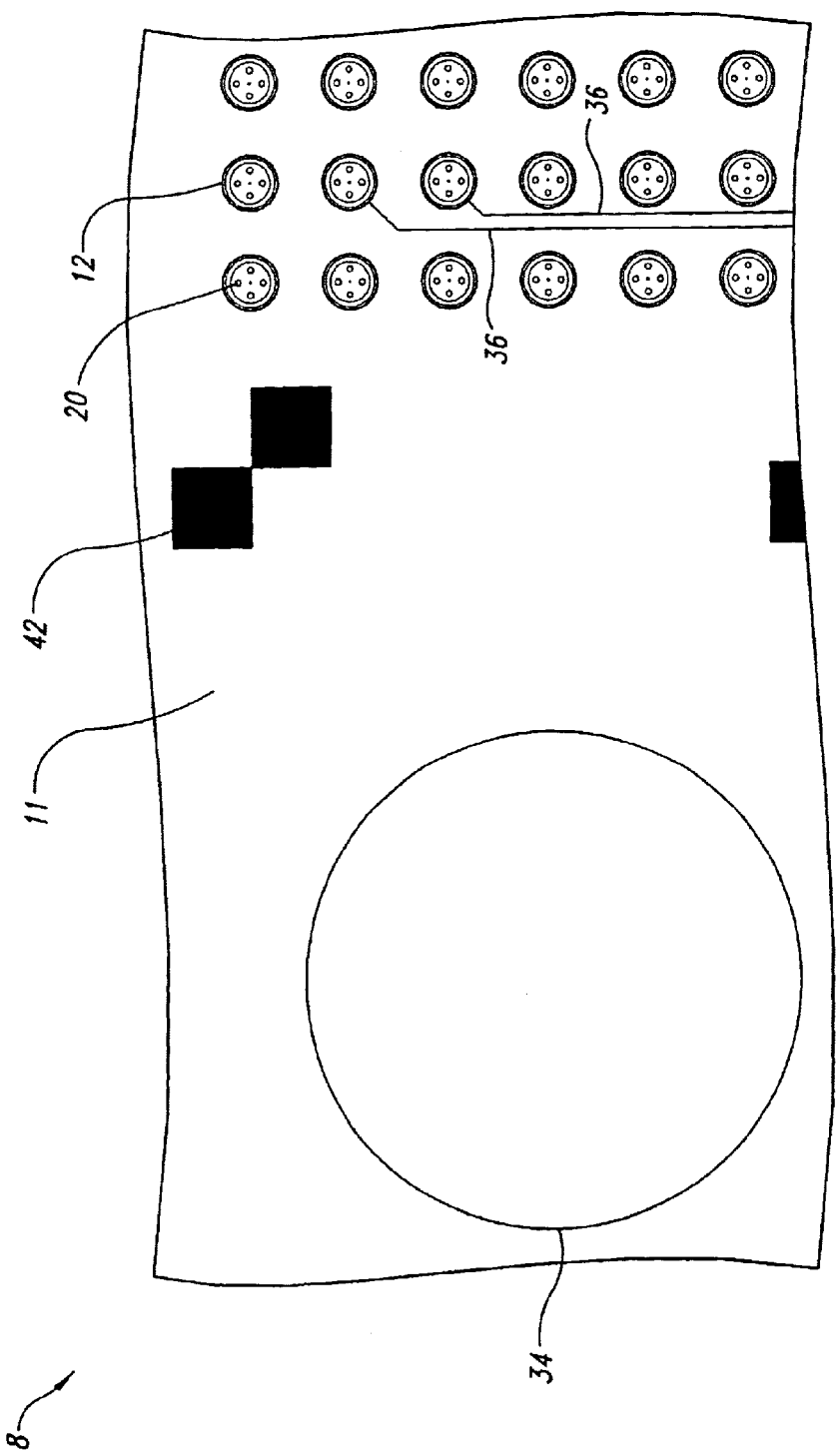
FIG. 3 is an enlarged view of a section of a connector, showing the relationship between the contact pads, alignment marks, and holes.

FIG. 3 shows an enlarged view of a connector, showing a number of contact pads 12, a pair of alignment marks 42, and a single alignment hole 34. Also shown on the surface of the contact pads are micro-pads 20.

The alignment holes 34 are a further electronic component features which is formed in the connector 8. In this example, the electronic component 34 is an alignment structure which will be later used to align the micro-pads 20 with the contact electrodes on a separate circuit board. Thus, since the alignment hole 34 will be used to precisely register and align a separate circuit board with the micro-pads, it is desirable that the position of the alignment hole 34 with the micro-pads 20 be highly precise and reliable for each individual connector 8.

A guide pin is used to align the alignment hole 34 with a similar hole in a circuit board. When the connector is correctly aligned with a circuit board and appropriate pressure is applied, each contact pad 12 makes contact with a corresponding pad on the circuit board. The actual electrical connection is made by the micro-pads 20, which are the top part of the contact pad which make contact with the corresponding pad on the circuit board.

According to the principles of the invention, the mask that is used to plate the micro-pads 20 onto the surface of the contact pads 12 is the same mask used to create and plate the alignment marks 42. In a later step of the manufacturing process, a laser cutter is employed to cut the alignment holes 34. After locating three alignment marks 42, an optical sensor, laser, or other guide aligns with the alignment marks 42 and a laser or punch or other cutting tool cuts the alignment holes 34. In this manner the positional relationship of the micro-pads 20, and the alignment holes is closely controlled and very precise.

At least three marks are required in order to establish a local cartesian coordinates system, that is, a system of coordinates that is specific to a single connector. In this manner, distortion and rotation, which will be present to some degree in the masks used to produce the master sheet, can be compensated and corrected. This makes possible the necessary precision required to position the alignment holes.

Figure 4A:
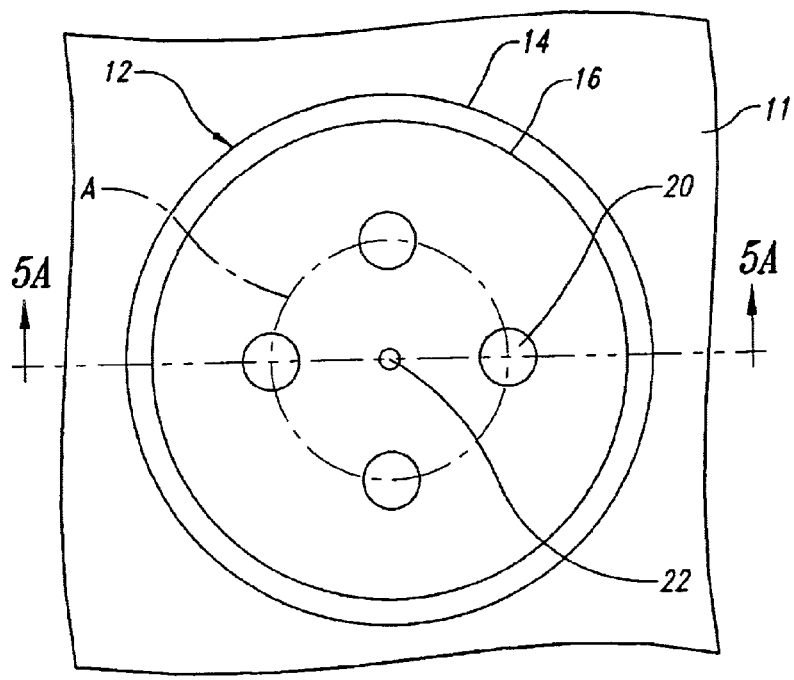
FIG. 4A is a plan view of a single contact pad, showing micro-pads in the correct position.

FIG. 4A shows a plan view of a single contact pad 12. In the flexible connector 8 illustrated here, the contact pads 12 have a diameter in the range of 0.03 inches. Micro-pads 20 are provided on the surface of the contact pads, and are the only part of the contact pad that actually makes contact with the circuit board. These micro-pads 20 have a diameter in the range of 0.004 inches. They are arranged in a circle having a diameter of about 0.015 inches. The micro-pads are formed on the surface of the contact pad using a plating process but could also be formed by deposit and etch or other technique. The contact pads 20 are also formed using the same guide holes 44 in a prior process step. The mask for making the micro-pads 20 is registered to the master sheet 9 (FIG. 1) using the guide holes 44 (FIG. 1) in the master sheet. As is evident by viewing the preceding Figures, the size of the micro-pads, relative to the master sheet, and the plating mask that would be used to form them, is very small. As a result, the position of the micro-pads on the surface of the contact pads is subject to some error.

The location of the contact pads 12 with respect to the micro-pads 20 will have the precision which is allowed using a common set of guide holes 44. This precision will be based on the tolerances permitted for the guide holes 44 with respect to components formed on the substrate. As can be appreciated, all masks have certain tolerances with respect to the alignment marks and, to be assured that various electronic components align with each other, they must have a size and a location such that even with the maximum possible deviation within the tolerance level the components are still sufficiently aligned with respect to each other to be operational. In the example shown in FIG. 4A, the two features are aligned with each other in an exact, accurate alignment as desired. The center 22 of the contact pad is precisely aligned with the center of the circle of the micro-pads 20. This is, of course, the preferred location of the micro-pads 20 on the contact pads 12 and the features on the respective masks are formed so as to obtain this result if all the marks are properly aligned. As can be appreciated, however, each of the alignment masks is only accurate to within certain tolerances as will now be explained.

Figure 4B:
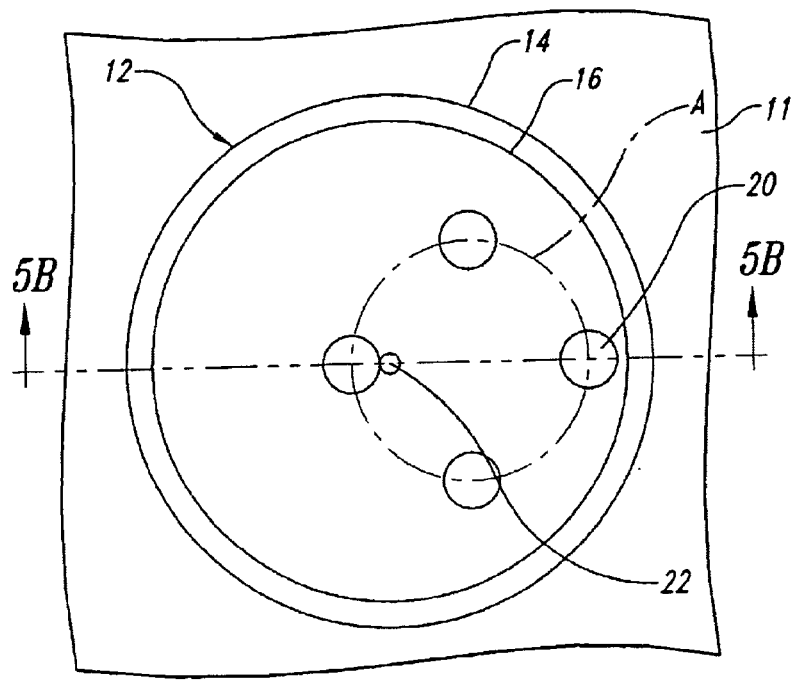
FIG. 4B shows a similar view, in which the micro-pads are misaligned.

FIG. 4B shows how the micro-pads might appear on the surface of a contact pad in the event that the maximum allowable deviation from ideal occurs. In this example, either the contact pad 12 or the micro-bumps 20 or both are slightly out of alignment with respect to each other. Both the features are within the tolerance of the respective mask used for producing them. However, the contact pad 12 deviated slightly from the ideal location in a first direction even though it was in the accepted tolerance values. The mask used to form the alignment marks 20 also deviated from its ideal location, in a direction different from the deviation of the contact pad 12 so that the micro-pads 20, are not located at the center of the contact pad 12 as is desired. All of these electronic components are made using the same alignment marks, but since they were made using different masks they may be slightly offset with respect to each other. It is designed to ensure, that subsequent electronic components accurately align with the micro-pads 20 even though they may not be precisely aligned with respect to the contact pad 12 as will now be explained.

In the final assembled product, it is critical that the micro-pads 20 make solid contact with the corresponding pads 38 of the circuit board 40. The alignment holes are used to achieve alignment between the micro-pads and the printed circuit board. If the holes are formed using the same guide holes 44, located in the corners of the master sheet 9, as locators, it is possible that the same degree of deviation could occur. In that event, the contact pad of the circuit board might make contact with only one micro-pad, or even none, if the pads on the circuit board are out of position but still within the accepted tolerance values.

According to one embodiment of the invention, the same plating step used to form the micro-pads 20 is also used to form the secondary alignment marks 42 (FIG. 3) on every connector. This practice ensures that the position of the micro-pads is precisely located with respect to that of the alignment marks. The alignment holes are then positioned using the secondary alignment marks 42. The same procedure is followed to cut the alignment holes in each of the connectors on the master sheet. In this way, the alignment holes of each connector are aligned with the micro-pads on that same connector even though they are cut while all the connects are still on the master sheet 9.

Figure 5A:
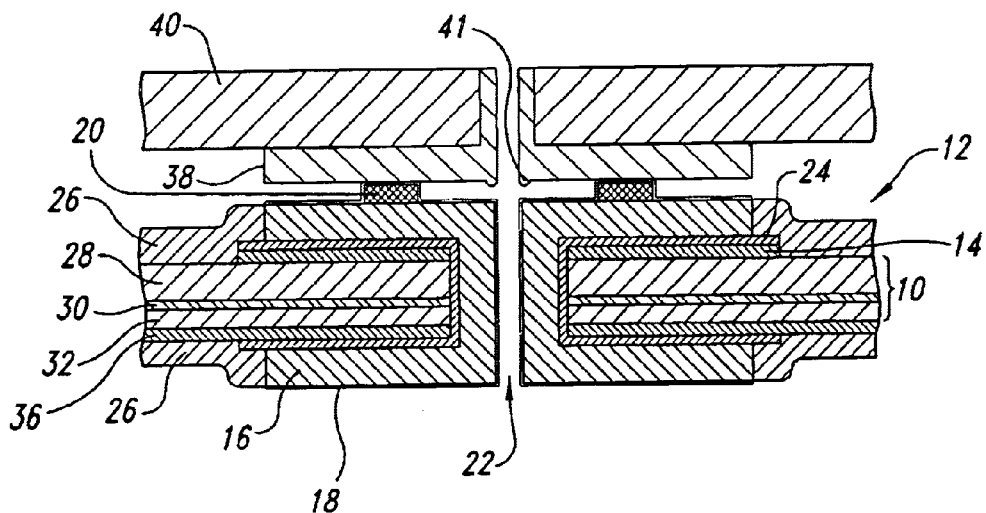
FIG. 5A is a cross section of the contact pad of FIG. 4A, viewed along the line 5A, shown in position against a contact pad of a circuit board.

FIG. 5A shows a cross section of the contact pad 12 of FIG. 4A, cut along the line 5A of FIG. 4A. Also shown is the detail of the substrate structure of the connector and the circuit board 40, with a contact pad 38 in alignment with the contact pad 12 and the micro-pads 20. The micro-pads 20 are shown in the ideal position as they appear in FIG. 4A.

Figure 5B:
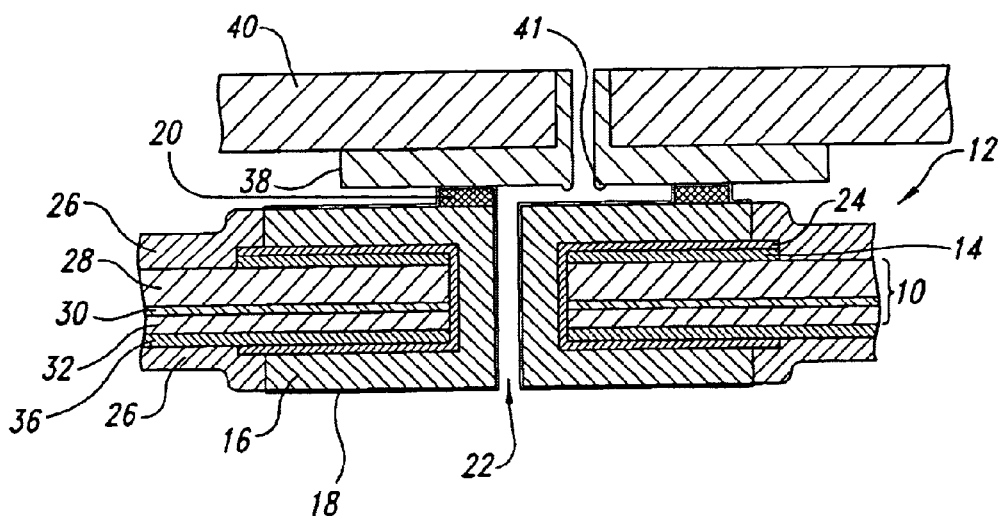
FIG. 5B is a cross section of the contact pad of FIG. 4B, viewed along the line 5B, shown in position against a contact pad of a circuit board.

FIG. 5B shows a cross section of FIG. 4B, showing the same features as FIG. 5A. In 5B the micro-pads 20 are misaligned, as they appear in FIG. 4B. It can be seen in this Figure that the pads 38 on the circuit board 40 are in correct alignment relative to the micro-pads, which ensures a solid electrical connection between the pads. The formation of knees 41 during the plating process used to form contact pads 38 on circuit boards can interfere with the electrical connection. By linking the position of the alignment holes to the position of the micro pads this problem is avoided.

Since the alignment structure for positioning the micro-pads relative to the circuit board was formed using registration marks made on the same mask as the micro-pads, they will be aligned with the circuit board pads 38, even if they are misaligned with respect to the contact pads 12.

Other electronic component features are on the connector 8, as shown in FIGS. 5A and 5B. These include non-conductive substrate layers 28 and 32, which, together with bonding layer 30, comprise the flexible substrate 10, non-conductive protective layers 26, electrical trace 36, and conductive layers 14, 24, 16 and 18. These various features were all formed using the guide holes 44 for alignment marks. Hole 22 has conductive material plated therein to form a conductive path to the various layers as needed.

The principles of the present invention may be used with respect to any of the layers shown in FIGS. 5A and 5B for the electrical connector 8. For example, in the event it is desired to form one of the intermediate layers, such as layer 24 precisely with respect to other layers to a greater tolerance than that permitted by the registration marks 44 it is possible, using principles of the present invention to create a set of alignment marks in the same mask as the feature to which alignment is required in the intermediate step. Then, when the subsequent electronic components are formed alignment is made to the intermediate alignment mark for these particular features. Then, other, subsequent features may be aligned with the master sheet alignment marks 44. Thus, for those components where extreme precision is needed, the extra time and expense for such precision is carried out and, for those features where looser tolerances are permitted the alignment marks for the master sheet may be used with the subsequent savings in time and cost.

The embodiment of the invention illustrated in the preceding figures and description deals with the manufacture of flexible electrical connectors. The principles of the invention may be applied to the manufacture of any electronic part that may be produced in quantity on master sheets or substrates, including flexible and rigid circuit connectors, circuit boards, integrated circuits, or the like.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method of making an electronic assembly on a substrate comprising:

providing a first set of alignment marks on a substrate;

forming a first group of electronic component features on the substrate using the first set of alignment marks to determine the position of the first group of electronic components on the substrate;

forming a second group of electronic component features on the substrate using the first set of alignment marks to determine the position of the second group of electronic components on the substrate;

forming a second group of alignment marks using the first set of alignment marks to determine the position of the second group of alignment marks on the substrate;

forming a third group of electronic component features on the substrate using the second group of alignment marks to determine the position of the third group of features on the substrate.

2. The method according to claim 1 wherein the second group of electronic component features and the second group of alignment marks are formed in the same process step using the same mask.

3. The method according to claim 1 wherein the third group of electronic component features are a third set of alignment marks.

4. The method according to claim 3 wherein the third set of alignment marks include apertures for aligning the substrate on a final product.

5. The method according to claim 1 wherein the first group of electronic component features includes electrically conductive traces formed on the printed circuit board.

6. The method according to claim 1 wherein the first group of electronic component features includes an insulating layer positioned over electrically conductive traces formed on the printed circuit board.

7. The method according to claim 1 further including forming a fourth group of electronic component features on the substrate prior to forming the third group of electronic component features, the fourth group of electronic components being positioned on the substrate using the first set of alignment marks.

8. The method according to claim 7 wherein the fourth group of electronic components features includes contact pads that are electrically conductive.

9. A method making a circuit assembly on a substrate comprising:
   providing a substrate having a first set of alignment marks;
   forming a first set of electronic components on the substrate using the first set of alignment marks to position the first set of electronic components on the substrate;
   forming a second set of electronic components on the substrate using the first set of alignment marks to position the second set of electronic components on the substrate;
   using the same mask that was used to form the second set of electronic components, also forming a second set of alignment marks so that the second set of alignment marks are assured of being a known distance from the second set of electronic components within the tolerances permitted on a single mask;
   forming an aperture in the substrate using the second set of alignment marks such that the position of the aperture relative to the second set of electronic components is more precise than it is with respect to the first set of electronic components.

10. The method according to claim 9 wherein the alignment structure is an aperture extending through the substrate, the aperture being provided to align a circuit board with the second set of electronic components.

11. The method according to claim 9 wherein the second set of electronic components is a set of contact pads for being placed in contact with electrodes on a printed circuit board.

12. The method according to claim 9 wherein only a single set of the first set of alignment marks are provided on the substrate and a plurality of sets of the first set of electronic components are formed using the single set of alignment marks.

13. The method according to claim 12 wherein a plurality of the second set of alignment marks are formed on the substrate at spaced locations on the substrate and a plurality of alignment structures are formed adjacent each of the respective second sets of the alignment marks using the set of alignment marks that are the closest to the alignment structures in order to determine the position of the alignment structures on the substrate.

14. The method according to claim 9 wherein the substrate is a flexible electrical connector composed of a plurality of electrically insulating layers and electrically conductive layers.

15. An electronic connector, comprising:
    a flexible substrate;
    a plurality of features positioned on said substrate with reference to a first set of registration guides;
    an additional feature positioned on said substrate with reference to said first set of registration guides;
    a second set of registration guides positioned on said substrate concurrently with said additional feature; and
    a second additional feature positioned on said substrate with reference to said second set of registration guides.

16. The connector according to claim 15 wherein said plurality of features includes a plurality of electrically conductive traces.

17. The connector according to claim 15 wherein said plurality of features includes a plurality of electrodes.

18. The connector according to claim 17 wherein said plurality of features includes a plurality of electrically conductive traces, and wherein each of said plurality of electrodes is in electrical contact with a corresponding one of said plurality of electrically conductive traces.

19. The connector according to claim 17 wherein a plurality of micro-pads are positioned on each of said plurality of electrodes.

20. The connector according to claim 19 wherein said plurality of micro-pads comprises said additional feature.

21. The connector according to claim 15 wherein said additional feature and said second set of registration guides are formed by plating a conductive metal on said flexible substrate.

22. The connector according to claim 15 wherein said second additional feature is a plurality of alignment holes.

23. The connector according to claim 15 wherein said concurrent positioning of said additional feature and said second set of registration guides results in a fixed and known positional relationship between the additional feature and the second set of registration guides.

24. The connector according to claim 23 wherein said positioning of said plurality of features with reference to said first set of registration guides results in a positional relationship fixed within known tolerances between any two of said plurality of features.

25. The connector according to claim 24 wherein said positional relationship between said additional feature and said second additional feature is fixed and known with a high degree of confidence as compared to said positional relationship between any two of said plurality of features.

26. An electronic connector, comprising:
    a flexible substrate;
    a plurality of electrodes positioned on said substrate with reference to a first set of registration guides,
    a first additional feature positioned on said substrate with reference to said first set of registration guides;
    a second set of registration guides positioned on said substrate concurrently with said additional feature;
    a second additional feature positioned on said substrate with reference to said second set of registration guides; and a plurality of micro-pads positioned on each of said plurality of electrodes.

27. The connector according to claim 26 wherein said plurality of micro-pads comprises the first additional feature.

28. An electronic connector, comprising:
   a flexible substrate;
   a first set of registration guides on the flexible substrate;
   a plurality of first features positioned on said substrate with reference to the first set of registration guides;
   a second feature positioned on said substrate with reference to said first set of registration guides;
   a second set of registration guides positioned on said substrate concurrently with said second feature; and
   a plurality of alignment holes positioned on said substrate with reference to said second set of registration guides.

29. An electronic connector, comprising:
   a flexible substrate;
   a first set of registration guides on the flexible substrate;
   a plurality of first features positioned on said substrate with reference to the first set of registration guides;
   a second feature positioned on said substrate with reference to said first set of registration guides;
   a second set of registration guides positioned on said substrate concurrently with said second feature; and
   a plurality of third features positioned on said substrate with reference to said second set of registration guides.

30. A device, comprising:
   a flexible substrate, the substrate being divided into a plurality of segments;
   a first set of alignment marks on the substrate;
   a plurality of features positioned on each of the plurality of segments of the substrate with reference to the first set of alignment marks;
   an additional set of alignment marks positioned on each of the plurality of segments with respect to the first set of alignment marks; and
   an additional feature positioned on each of the plurality of segments, the additional feature on each segment positioned with respect to the addition set of alignment marks of the respective segment.

31. The device of claim 30 wherein each of the plurality of segments is a flexible connector.

32. The device of claim 30, further comprising a second additional feature positioned on each of the plurality of segments with respect to the additional set of alignment marks of the respective segment.

* * * * *